INVENTOR.
KAP S. KIM
BY Martin L. Kacher ATTY.

Dec. 10, 1968 K. S. KIM 3,416,096

FREQUENCY SYNTHESIZER SYSTEMS FOR GENERATING ACCURATE RADIO FREQUENCY SIGNALS OF SELECTED FREQUENCIES

Filed Feb. 1, 1967 2 Sheets-Sheet 2

INVENTOR.
KAP S. KIM

BY [signature] ATTY.

United States Patent Office 3,416,096

Patented Dec. 10, 1968

3,416,096

FREQUENCY SYNTHESIZER SYSTEMS FOR GENERATING ACCURATE RADIO FREQUENCY SIGNALS OF SELECTED FREQUENCIES

Kap S. Kim, Fairport, N.Y., assignor to General Dynamics Corporation, a corporation of Delaware Filed Feb. 1, 1967, Ser. No. 613,307
10 Claims. (Cl. 331—2)

ABSTRACT OF THE DISCLOSURE

A frequency synthesizer is described which is suitable as a signal generator or for providing an injection signal to a frequency translator of a radio system. Phase locked loop techniques are used wherein a first phase locked loop is used to drive a second loop. The driven loop includes a frequency divider and synthesizes frequencies which are adapted to be phase compared with a precision reference frequency or with signals from the driving phase locked loop. Both loops operate conjointly to synthesize signals over a wide frequency range.

The present invention relates to electronic signal generator systems and particularly to frequency synthesizers. By a frequency synthesizer is meant a system for generating numerous signal frequencies all of which are based upon a precision frequency signal.

The invention is especially suitable for use in radios for providing injection signals to a frequency translator thereof, the injection signals being selected precisely so as to permit reception or transmission of single sideband signals. The invention is, however, generally useful in the generation of signals over a wide range of frequencies and may be used in test instruments, such as signal generators or the like.

Among the goals of frequency synthesizer design is coverage of a wide band of frequencies, each of which may be produced with high stability. The synthesizer is also desirably adapted to be packaged in a very small amount of space and of minimum weight. The synthesizer must also be adapted to be controlled or tuned readily, say digitally, or continuously by means of knobs which precisely select each frequency step or any segment of the frequency and the entire assemblage should be adapted to be manufactured at low cost.

In prior frequency synthesizers one or more of the foregoing goals have not been entirely met. For example, numerous oscillators, in addition to a reference frequency source, have been required together with mixers which combined outputs of the oscillators in a manner to eliminate frequency errors which might be introduced. Prior frequency synthesizers, even though employing phase locked loops have been subject to instabilities of various types including frequency jitter because of the wide frequency discrepancies between the ultimate output of the synthesizer and the reference frequency source used therein. Thus many cycles of the output frequency would occur during each cycle of the reference frequency source and the output frequency could change between times when the output is sampled for comparison with the reference frequency.

It is therefore an object of the present invention to provide improved electronic signal generator systems, which may be the type known as frequency synthesizers, wherein the foregoing goals are substantially obtained and the foregoing disadvantages substantially eliminated.

It is another object of the present invention to provide improved frequency synthesizers having better frequency and phase stability than has heretofore been obtained.

It is a further object of the present invention to provide improved frequency synthesizers which are adapted to be manufactured at low cost by reason, for example, of inclusion therein of available low cost sub-systems, such as digital counters.

It is a still further object of the present invention to provide an improved synthesizer which is adapted to be packaged in a very small amount of space, say less than ten cubic inches and is low in weight, say less than one pound.

It is a still further object of the present invention to provide an improved frequency synthesizer which is effectively operable over a wide frequency range, say 2 mHz. to 86 mHz. and is adapted for use in single sideband radios.

Briefly described, a frequency synthesizer or signal generator embodying the invention includes a pair of phase locked loops, first of which drives the second. The second phase locked loop includes a frequency divider, such as a counter which divides the frequency output by a fixed divisor. The output of the first phase locked loop is phased compared with the output of the second so that the signal frequencies produced by both phase locked loops will be phase coherent with each other although of different frequency. A precision reference frequency signal is applied to the first loop and, by virtue of the phase coherent relationship of the signal produced by the loops, precisely locks the output of both loops. Inasmuch as the loops operate at different frequencies, their conjoint operation will also produce signals which may be varied over a wide range of frequencies. In one embodiment the second loop may be included within the first loop, thereby permitting the variable frequency oscillator of the first loop to produce the output signals over the range of frequency. Alternately, output signals may be obtained from the variable frequency oscillator from the first and second loops. Each loop output may be used for a different part of the frequency range so that conjointly they cover the entire range. In accordance with a still further embodiment, a still wider range of frequency may be generated by heterodyning the output signals from the second or driven loop with reference signals from the frequency standard and by translating the output of the first loop by a selected frequency increment before applying it to the second loop.

The invention itself, both as to its organization and method of operation, as well as additional objects and advantages thereof will become more readily apparent from a reading of the following description in connection with the accompanying drawings in which.

Figures 1, 2, 4:
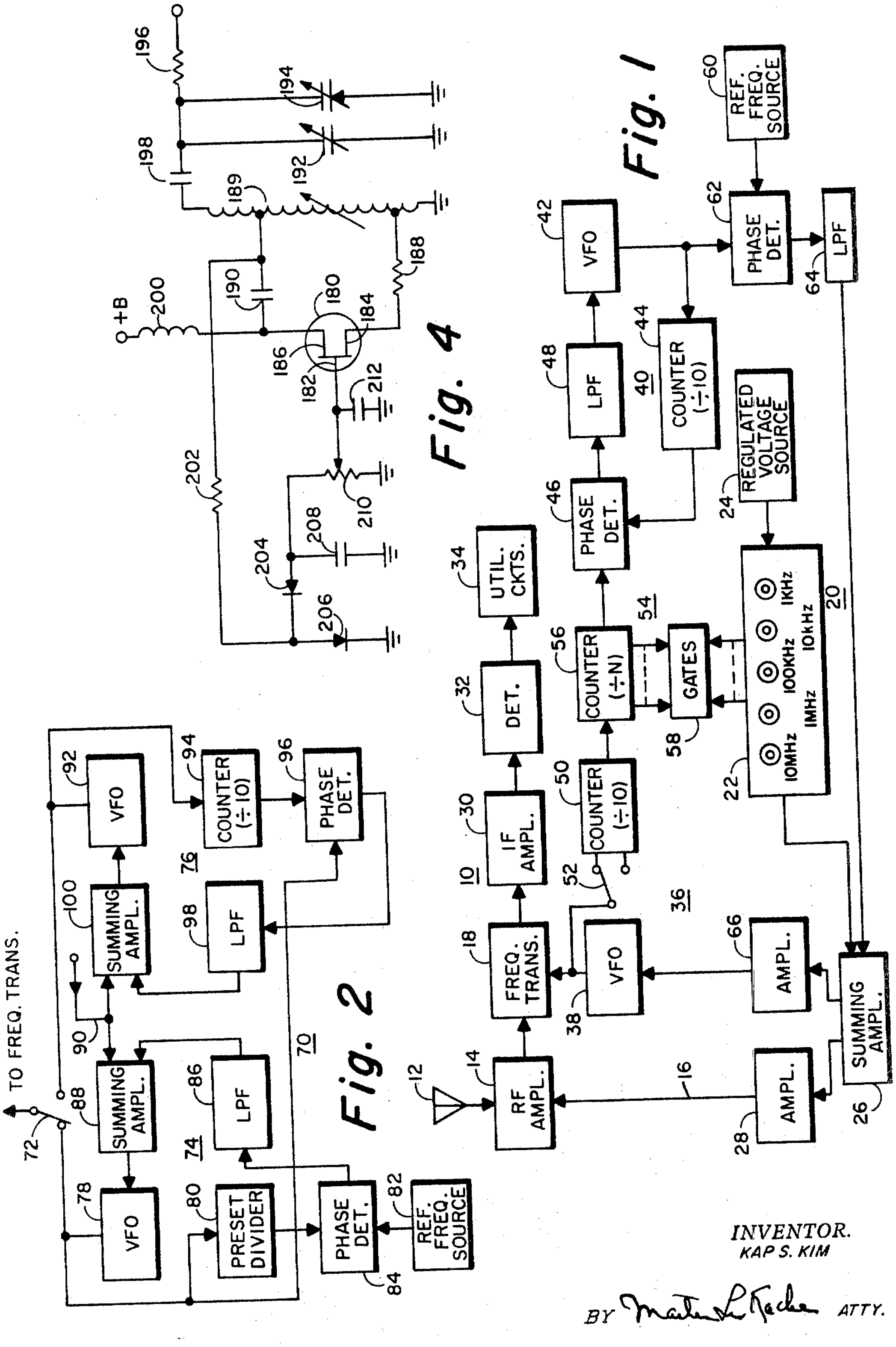
FIG. 1 is a block diagram of a radio system incorporating a frequency synthesizer in accordance with one embodiment of the invention.
FIG. 2 is a block diagram of a frequency synthesizer in accordance with another embodiment of the invention.
FIG. 4 is a schematic diagram of a variable frequency oscillator which may be used in the systems shown in FIGS. 1–3.

Referring more particularly to FIG. 1, the radio 10, which is shown, includes an antenna 12 feeding a tunable radio frequency amplifier 14. This amplifier may contain tuned circuits including voltage variable capacitors which are responsive to a tuning voltage applied thereto along a line 16 in drawing. The nature and operation of such amplifiers is discussed in U.S. Patent No. 3,249,876, issued on May 3, 1966 to J. R. Harrison. The output of the amplifier 14 is applied to a frequency translator or mixer stage 18 wherein the signal passing through the amplifier 14 is translated to an intermediate frequency.

For purposes of this translation, a frequency synthesizer 20 is provided for supplying the proper frequency injection signal to the frequency translator 18 so as to select the frequency to which the receiver is tuned. Tuning may be accomplished by means of tuning controls which are shown as digital tuning control knobs on a control box 22. Five knobs are illustrated which, respectively, select the 10 mHz., 1 mHz., 100 kHz., 10 kHz. and 1 kHz. digits of the frequency to which the radio is tuned. The tuning voltage, which is provided along line 16, is generated in part by the control box. To this end, regulated voltage source 24 applies a voltage to the control box 22. This voltage is varied in the box 22 and applied via a summing amplifier 26 (an amplifier having an adding resistor network in its input, for example) and a buffer amplifier 28 to the line 16. Precision potentiometers in the control box 22 generate the tuning voltage on a coarse basis. Fine tuning voltages are generated in the course of operation of the synthesizer 20 in a manner to be discussed hereinafter. Reference may be had to the above-mentioned Harrison patent for a more detailed discussion of the generation of coarse tuning voltages in this manner.

An intermediate frequency (IF) amplifier 30 selects the desired intermediate frequency signal from the translator 18 and applies it to a detector 32 whereat the output signals are generated for application to utilization circuits 34. The detector may contain suitable filters in the event that single sideband signals are to be detected and also may include either AM, FM, or FSK detection circuits. The utilization circuits can be the audio amplifiers which drive headsets or loud speakers or a demodulator for obtaining the bits of a digital message which may be detected, say when such bits are transmitted by FSK techniques.

The synthesizer 20 includes a first phase locked loop 36 having a variable frequency oscillator (VFO) 38 and a second phase clocked loop 40 which is driven by the first phase locked loop and which has its own VFO 42. The VFO's may be voltage controlled oscillators including voltage variable capacitors (VVC's) of the type known in the art. A preferred VFO is illustrated in FIG. 4 and will be discussed hereinafter. It will be appreciated, of course, that the VFO's may be controlled by a tuning voltage applied to the VVC's thereof, so as to be tuned both in frequency and in phase over their tuning range. Of course, a plurality of VFO's may be used for different segments of the tuning range of the synthesizer if desired, and the VFO allocated to a specific portion of the range may be switched into the system by means of switches operated by the tuning controls in the box 22.

The second phase locked loop 40 includes, in addition to the VFO 42 a frequency divider in the form of a counter 44. This counter 44 which is illustrated as a decade counter, divides the output frequency of the VFO 42 by ten and applies the divided frequency to a phase detector 46. This phase detector receives the second loop 40 driving signal and compares it with the output of the counter to derive a control voltage which is filtered in a low pass filter 48 and is applied to tune the VVC's of the VFO 42 to a frequency which is phase coherent with the frequency of the driving signal from the loop 36, but is of course ten times the frequency of that signal. The phase detector 46 may be a pair of AND or NAND gates which are flip-flop interconnected so as to be set and reset by the counter 44 output and by the input from the first loop 36, respectively.

The first loop 36 includes a frequency divider in the form of a decade counter 50 which may be included in the loop in the event that a switch 52, which is connected from the VFO 38 output to the input of the counter, is in the position shown in the drawing. The counter 50 is used in the event that signals in the upper part of the frequency range (high-band) of the synthesizer are to be generated. The switch 52 position is reversed if low band signals are to be synthesized.

A preset counter system 54 divides the output of the VFO by a number N depending upon the frequency selected by the control box 22 so that a fixed frequency is applied to the driving input of the second loop 40 at the phase detector 46. The preset counter includes a plurality of decade counters 56 which are selectably connected through gates 58 in accordance with a code generated by switches controlled by the knobs of the control box 22. For different settings of the knobs, enabling voltages are applied to different ones of the gates 58 in accordance with the code so that the counter 56 will count to the desired number of cycles of the VFO output, or the VFO output divided in frequency by the counter 50. When this count is reached, the counter will produce an output pulse which will be applied to the phase detector 46 and thereupon will reset the counter. By way of example, it will be assumed that the receiver is tuned to a frequency of 2 mHz. The desired synthesizer output frequency for an intermediate frequency of 455 kHz. is 2.455 mHz. The adjustment of the 10 mHz. knob in the control to two and the remaining knobs of the control to zero will enable that combination of the gates 58 which will cause the counter to divide by 2,455. Accordingly, the counter produces an output pulse at a frequency of 1 kHz. In that case, the second loop 40 and VFO 42 will oscillate at a frequency of 10 kHz, which divided in the counter produces a phase detector 46 input of 1 kHz., which is phase locked to the 1 kHz. output of the counter 56. In the example just mentioned, N is 2,455.

It will be appreciated, of course, that the first phase locked loop 36 also includes the second phase locked loop 40, which is series connected therein. Inasmuch as the second phase locked loop 40 is phase locked with the first phase locked loop (viz. the outputs of the VFO's 38 and 42 are phase coherent with each other), the output of the second phase locked loop, when locked to a reference frequency from a reference frequency source 60, will lock both VFO's 38 and 42 to the precision reference frequency produced by the source 60 and therefore will produce precise and stable output frequencies locked to the source 60. Such locking is accomplished in the first loop 36 phase detector 62 which may be a similar design of the phase detector 46. The output of this phase detector 62 is passed through a low pass filter 64 to produce a varying DC control voltage which is applied to the summing amplifier 26. This control voltage is the fine tuning voltage which was mentioned above. The combined coarse and fine tuning voltages are applied to the VFO 38 by way of a buffer amplifier 66.

A function generator may be connected between the control box and summing amplifier. This function generator may be an operational amplifier with suitable feedback networks to provide a transfer characteristic, which effect a change in tuning which is linearly related to the coarse tuning voltage generated by the control box 22, notwithstanding the non-linear characteristic of the VVC's in the RF amplifier 14 and VFO 38.

Assume by way of example, that it is desirable to tune the radio to frequencies over the range from 2 mHz. to 86.999 mHz. In this case, the low band is selected by alternating the position of the switch 52 which connects the VFO 38 directly to the counter 56. The synthesizer output as obtained from the VFO 38 is then produced over the range from 2.455 to 9.999 mHz. The counter 50 is used when frequencies from 10 to 87.454 mHz. are to be synthesized. In order to produce a 1 kHz. output from the preset counter 54, the counter 56 is adapted to divide over the range from 1,000 to 10,000. The counter must be capable of handling signals having frequencies up to 10 mHz. Inasmuch as 10 mHz. presettable counters may readily be designed in accordance with known techniques, the counter system may readily be provided at low cost. The reference frequency from the source 60 is 10 kHz. It will be appreciated, of course, that if the reference frequency is 1 kHz., the counter 44 should be constituted of a decade counter which would divide the output frequency from the VFO 42 by 10 so as to derive a 1 kHz. input from the counter 44 to the phase detector 46. The knobs of the control box 22 are used to select the desired frequency. These knobs will be locked with the switch 52 so as to switch to the lower contact of the switch 52 when the knobs are set for frequencies below 10 mHz. Such setting of the knobs will also generate a coarse tuning voltage which will tune the VFO 38 to approximately the desired injection frequency. Differences in the frequency of the VFO 38 from the dial setting will produce an output from the counter 56 at other than a 1 kHz. rate. This frequency deviation is coherently translated by the driven or the second loop 40 to an output frequency which is compared with the reference frequency in the phase detector 62. Inasmuch as the VFO 42 operates at approximately the same frequency as the reference frequency, comparison in the phase detector 62 is accomplished on an almost a cycle-by-cycle basis, thus insuring stability in the system. The phase detector 62 and a low pass filter 64 produce an error signal which provides the fine tuning voltage and tunes the VFO to precisely the frequency selected by the knobs in the control box 22, plus the 455 kHz. intermediate frequency offset. When the loops are locked, the output of the preset counter 54 will be precisely at 1 kHz. and in phase with the reference frequency from the source 60. In high-band operation, of course, the output frequency of the VFO 38 will be variable in 10 kHz. steps. Thus, wide band, stable, coherent operation of the frequency synthesizer is obtained without the need for mixing operations or extraneous oscillations which may produce frequency and phase errors.

FIG. 2 illustrates a frequency synthesizer 70 which may be used in a manner similar to the synthesizer 20 of FIG. 1 to supply injection signals to a frequency translator stage of a radio system. The injection signals are obtained at the movable contact of a single pole, double throw switch 72. The synthesizer includes a first or driving phase locked loop 74 and a second or driven phase locked loop 76. The driving loop includes a variable frequency oscillator 78 similar to the variable frequency oscillator 38. A preset divider 80, similar to the divider 54, divides the output frequency of the VFO by a number N in accordance with the setting of the knobs of a control box (not shown) but which may be similar to the control box 22. The output of the preset divider is compared in phase with a precision reference frequency signal from a reference frequency source 82 in a phase detector 84. The phase detector output is low pass filtered in a filter 86 to provide a fine tuning voltage which is applied to a summing amplifier 88, and thence to the VVC's in the VFO 78. A coarse tuning voltage, say from the control box, is supplied over a line 90 to the summing amplifier 88. These tuning voltages are applied to the VFO 78. The tuning voltages may also be applied to tune the RF amplifier circuits of the radio.

The second loop 76 contains a variable frequency oscillator 92 similar to the oscillator 38, a fixed frequency divider illustrated as the decade counter 94 and a phase detector 96. The phase detector receives the second loop driving signal from the output of the first loop VFO 78. A fine tuning voltage for the second loop is derived after low pass filtering in a filter 98. This tuning voltage is applied via a summing amplifier 100, where it is combined with the coarse tuning voltage, to the VFO 92. The output of the second loop is taken at the output of the VFO 92. Inasmuch as the second loop is locked to the output of the first loop, the frequency of the second loop VFO 92 will be the same as, and phase coherent with, the frequency of the first loop of the VFO, but ten times higher in frequency. The frequencies produced by both loops will, of course, be phase coherent with the reference frequency signal from the source 82.

In the event that the reference frequency source 82 produces a reference frequency of 1 kHz., the preset divider may be used to tune the first loop to provide output signals which may be varied in frequency in 1 kHz. steps. Because of the multiplication by ten in the second loop 76, the output frequencies from the driven loop 76 will be variable in 10 kHz. steps. In the event that the same frequency range (from 2 to 86.999 mHz.) is to be covered, as is the case with the synthesizer 20 (FIG. 1), the first VFO 78 may be designed to operate over the range from 1.2 to 12 mHz., while the second VFO 92 operates over the range from 12 to 87.454 mHz.

Figure 3:
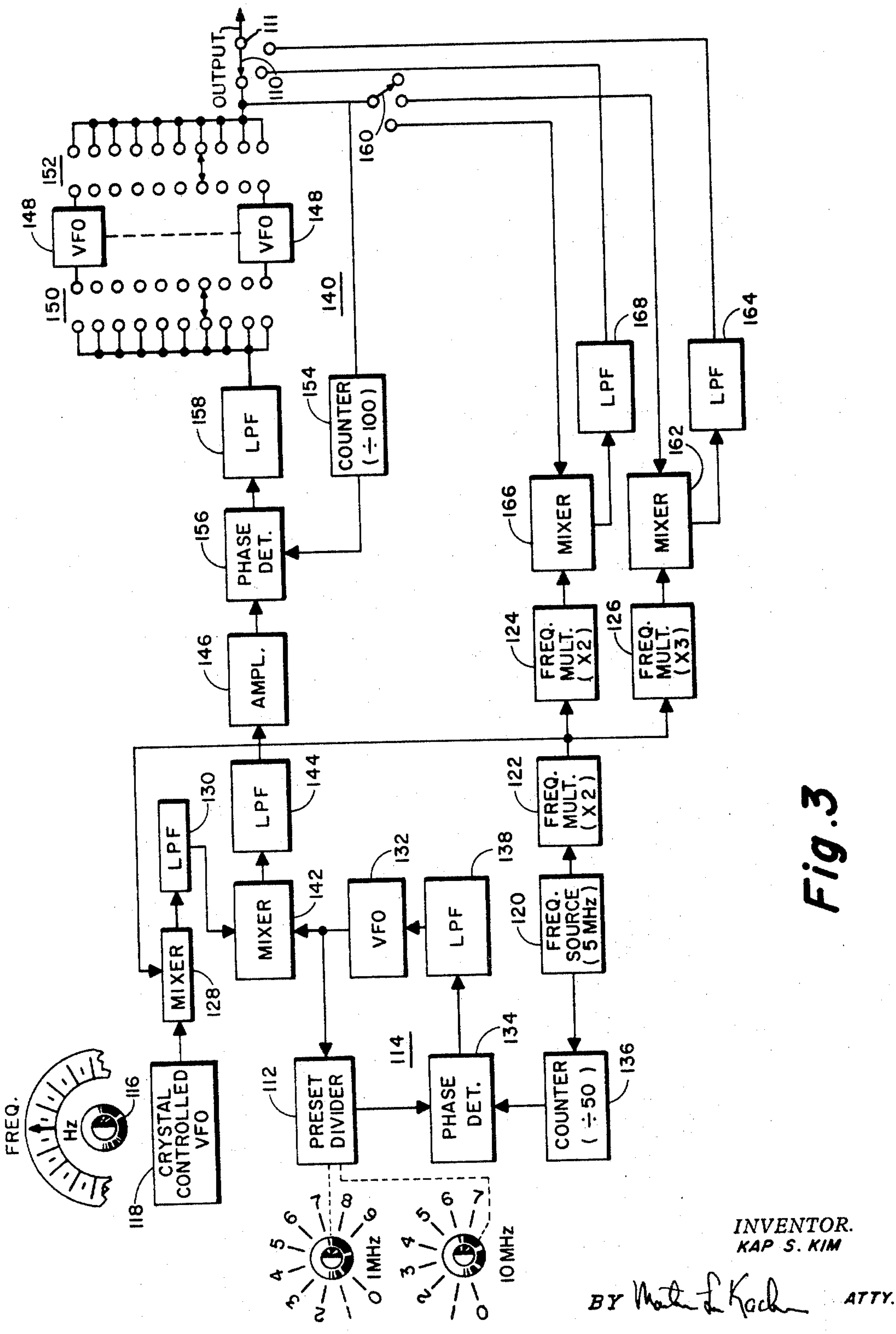
FIG. 3 is a block diagram of a signal generator in accordance with still another embodiment of the invention.

FIG. 3 illustrates a signal generator which is adapted to cover the range from substantially DC to 70 mHz. It will be appreciated, of course, that the range may be extended to higher frequencies by operating the VFO's in the driving and driven phase locked loops over a wider frequency range. The outputs are obtained at a terminal 111 which is connected to the pole of a three pole switch 110. The frequency is selected by means of a 10 mHz. control knob and a 1 mHz. control knob which may be connected to a preset divider 112 in a first or driving phase locked loop 114 and by a vernier control knob 116 which changes the frequency in continuous fashion. This knob 116 is marked Hz. to indicate that it can control the frequency down to a Hz. This knob 116 is mechanically coupled to a tuning element in a crystal controlled VFO 118. It is desirable that the indicator be coupled to the knob 116 through a vernier mechanism for more precise frequency selection. More specifically, the crystal controlled VFO 118 may be a crystal controlled clapp oscillator having a variable capacitor which is mechanically coupled to the control knob 116 via the vernier mechanism.

A reference frequency source 120, which may be a crystal controlled oscillator, contained in a temperature regulated oven, is coupled to a frequency multiplier 122 which in turn is coupled to frequency multipliers 124 and 126 to obtain reference frequencies for the signal generator system. It will be appreciated, of course, that a spectrum generator with suitable filters may, alternatively be used. The reference frequency source is indicated for purposes of illustration as having a frequency of 5 mHz. For more precise frequency control, it is desirable to operate the crystal controlled VFO 118 at a nominal frequency higher than that which is used in the system. A nominal frequency of 2 mHz. is desired. It is desirable in the interest of greater frequency stability, linearity and control in the crystal controlled VFO 118 to operate it at approximately 12 mHz. Thus, by mixing the 10 mHz. reference frequency from the multiplier 122 with the crystal controlled VFO 118 output in a mixer 128 and extracting the low sideband product by means of a low pass filter 130, the desired nominal frequency of 2 mHz. is obtained. As will be more apparent as the description proceeds, it is desirable to vary the frequency of the oscillator by 12 kHz. Thus, the output frequency from the low pass filter 130 can be varied from 2 mHz. to 2.012 mHz.

The first phase locked loop 114 includes a variable frequency oscillator 132 which may be similar to the variable frequency oscillator in the driving loops described below. The output of this oscillator is divided in frequency by a preset divider 112 by an integer N in accordance with the settings of 1 mHz. and 10 mHz. control knobs. The divisor is such that a 10 kHz. signal is always presented to a phase detector 134 which receives a 10 kHz. reference signal from the reference source 120. This signal is obtained by dividing the output of the reference source 120 by means of a counter 136 which divides by 50. The variable frequency oscillator 132 is tuned over a range from 2.2 to 2.7 mHz. by means of a tuning voltage obtained from the output of the phase detector 134 after filtering in a low pass filter 138. Thus, the preset divider 112 is adapted to divide by the divisor N which may be from 220 to 270 in integral steps. The steps of 10 mHz. are selected by the eight position 10 mHz. knob and additional steps of 1 mHz. are selected by the ten position 1 mHz. knob. Although the output frequency of the first loop 114 extends from 2.2 to 2.7 mHz., it is translated so as to cover the entire frequency range of signal generation by means of a second phase locked loop 140 and the other frequency translation stages of the system, to be described hereinafter.

The output of the first loop 114 is offset from 2 mHz. to 2.012 mHz. by a frequency translation in a mixer 142. The lower sideband products are extracted by a low pass filter 144. Thus, the output of the low pass filter may extend from 200 kHz. to 700 kHz., which may be varied continuously in accordance with the setting of the knobs controlling the preset divider 112 and the frequency control knob 116. The translated signals at the output of the filter 144 are amplified and shaped into pulses by an amplifier circuit 146 so as to provide the signals for driving the second loop 140.

The second loop includes a plurality of variable frequency oscillators 148, each of which covers a successive portion of the frequency band from 20 to 70 mHz. The desired VFO is selected by means of switches 150 and 152 which may be interlocked with the 1 and 10 mHz. knobs. Although the use of a plurality of VFO's 148 is preferred, it may be desired to use a single VFO which can be tuned over the entire band from 20 to 70 mHz. To that end, it will be desirable to generate coarse tuning voltages in accordance with the setting of the 1 and 10 mHz. knobs, in the manner similar to that discussed in connection with FIG. 1. The output of the VFO 148 is divided in frequency in a counter 154 which may be constituted of a pair of decade dividers connected in series.

Signal frequencies which vary between 200 and 700 kHz. are applied to a phase detector 156 in the second loop 140. In this phase detector 156, the driving signals from the first phase locked loop 114, suitably translated in frequency in accordance with the setting of the crystal controlled VFO 118, are compared with the VFO 148 output and a tuning voltage is derived by filtering the output of the detector 156 in a low pass filter 158. The selected VFO 148 is tuned by means of this tuning voltage to the frequency determined by the setting of the knobs. This frequency may be varied in any incremental frequency steps by setting of the 10 mHz., 1 mHz. and vernier knobs 116.

If output frequencies in the range of 20 to 70 mHz. are desired, these may be selected by positioning the switch 110 in the position shown in the drawing. For frequencies in the range from 10 mHz. to 20 mHz., a frequency translator stage is selected by means of a switch 160. This switch may, of course, be ganged with the 10 mHz. knob. When the range for 10 mHz. to 20 mHz. is selected, the second loop 140 output signals are then applied to a mixer 162 together with the output of the frequency multiplier 126. Thus, a reference injection frequency of 30 mHz. will be heterodyned with the frequency selected from the loop 140 when that loop is operating in the range from 40 to 50 mHz. The lower sideband product is extracted by means of a low pass filter 164 and applied to the 10 to 20 mHz. terminal of the output switch 110. When frequencies from 0 mHz. to 10 mHz. are desired, signals in the range from 20 to 30 mHz. which are generated in the second phase locked loop 140 are mixed in a mixer 166 with the frequency from the multiplier 124 which will be of 20 mHz. The lower sideband products are extracted by a low pass filter 168 and applied to the 0 Hz. to 10 mHz. terminal of the output switch 110. Inasmuch as all of the switches 110, 150, 152 and 160 may be ganged with the 10 mHz. and 1 mHz. knobs, the entire frequency range is selected by means of only three controls (viz. the 10 mHz. knob, the 1 mHz. knob and the vernier knob 116).

The stability of the signal generator is a function of the stability of the reference frequency source 120 and of the crystal controlled VFO 118, inasmuch as the output signal is phase locked to both of these units. At the present time, crystal controlled VFO's of the type described herein can be constructed in accordance with known design techniques to have a short term stability of 1 Hz. in $2\times10^9$ Hz. Of course, the stability of the source 120 is even better, and that source controls the generation of the higher portion of the frequency (viz. the first two, and most significant digits). This may become more apparent from the following example, where a frequency of 69.777777 mHz. is selected. The preset divider knobs select the 10 mHz. and 1 mHz. digits 69. ______ which are locked to be the reference source 120. Only 777,777 Hz. is selected by the vernier knob 116, well within the range of the stability of the VFO 118. In other words, the vernier knob 116 can control the output frequency over the range of 1.2 mHz. continuously, while the output frequency is phase locked to the VFO 118.

A variable frequency oscillator which may be used in the systems described above is illustrated in FIG. 4. This oscillator has among its advantages, a low power drain, inasmuch as it utilizes a field effect transistor 180 having a gate 182, source 184 and drain 186 electrodes. The oscillator is effectively of the Hartley type, inasmuch as it has a tapped coil 189 which is coupled between the source 184 and drain 186 electrodes by way of a resistor 188 and a capacitor 190. The coil 189 is connected in a parallel tuned circuit with a trimmer capacitor 192 and a voltage variable capacitor 194. A tuning voltage for the voltage variable capacitor may be applied thereto by way of a resistor 196. An isolation capacitor 198 for isolating the tuning voltage from the coil is included in the tuned circuit and its effect on the frequency of oscillation is negligible. An operating voltage is applied from a source indicated at +B by way of an RF choke 200. In order to stabilize the oscillator, a portion of the output voltage which may be obtained at the upper tap of the coil 189 is fed back by way of a resistor 202 to the junction of a pair of diodes 204 and 206. The capacitor 208 is connected across these diodes so that the circuit including the diodes 204 and 206 and capacitor 208 is effectively a voltage doubler rectifier which provides a direct current stabilizing voltage. This voltage is filtered by an RC circuit including a potentiometer 210 and a capacitor 212. The proper stabilization potential is applied to the gate electrode by adjusting the potentiometer.

From the foregoing description it will be apparent that there have been provided improved systems for the generation of electronic signals over a wide band of frequencies. The systems are adapted to synthesize signals with a high degree of stability and precision and through the use of a minimum of sub-circuits and components. The reduction in circuits and complexity permits the systems to be readily manufactured at low cost. Although three systems, each including different embodiments of the invention have been described, it will be appreciated that these systems are discussed for purposes of explaining the invention and that variations and modifications therein within the spirit of the invention will be apparent to those skilled in the art. Thus, the foregoing descriptions should be taken merely as illustrative and not in any limiting sense.

What is claimed is:

1. An electronic signal generating system for synthesizing signals based upon the signals generated by a precision frequency source, which system comprises (a) a first phase locked loop for generating signals, the frequency of which may be varied in selected frequency increment, (b) a second phase locked loop including means for locking said loop at a frequency which is an integral multiple of a frequency produced in said first loop, and (c) said first loop including means for locking said first loop to the frequency produced by said reference frequency source.

2. The invention as set forth in claim 1 wherein said means for locking said second loop includes a fixed frequency divider for dividing the output frequency produced by said second loop and a phase detector for comparing said first loop signal with the signal produced by said divider.

3. The invention as set forth in claim 1 wherein said second loop is coupled in series within said first loop.

4. The invention as set forth in claim 2 wherein said first loop produces an alternating current signal and a direct current tuning voltage, and means for applying said alternating current signal to an input of said second loop phase detector.

5. The invention as set forth in claim 4 wherein said first loop includes a variable frequency oscillator which produces said alternating current signal and means for applying said alternating current signal to said second loop phase detector.

6. The invention as set forth in claim 2 wherein said first loop includes a preset divider for dividing the output frequency of said first loop to a given frequency.

7. The invention as set forth in claim 2 including a variable frequency oscillator, means for translating said first loop output signal to a frequency determined by the setting of said variable frequency oscillator, and means for applying said translated output to said second loop for locking said second loop.

8. The invention as set forth in claim 7 including a plurality of frequency translation stages, means for applying reference signals of different frequencies to different ones of said stages and means for selectively applying the output of said second loop to different ones of said stages for selectively generating signals from each of said stages which may be varied incrementally in accordance with the frequencies produced in said first loop and by said variable frequency oscillator.

9. The invention as set forth in claim 7 wherein said variable frequency oscillator is continuously adjustable in frequency and wherein said loop includes a preset divider which is incrementally adjustable in dividing ratio.

10. A frequency synthesizer comprising (a) a frequency standard, (b) a first phase locked loop including means for generating output frequencies locked to said frequency standard, (c) a second phase locked loop including a fixed frequency divider connected between the variable frequency oscillator and the phase detector thereof, and (d) means for applying the output frequencies of said first loop to said second loop phase detector.

References Cited

UNITED STATES PATENTS

| | | | |
|---|---|---|---|
| 2,942,203 | 6/1960 | Winkler | 331—18 X |
| 3,202,930 | 8/1965 | Muraszko | 331—2 |

ROY LAKE, *Primary Examiner.*

S. H. GRIMM, *Assistant Examiner.*

U.S. Cl. X.R.

331—11, 25, 36, 117